(12) United States Patent
Carissimi et al.

(10) Patent No.: US 11,133,064 B2
(45) Date of Patent: Sep. 28, 2021

(54) LATCH-TYPE SENSE AMPLIFIER FOR A NON-VOLATILE MEMORY WITH REDUCED MARGIN BETWEEN SUPPLY VOLTAGE AND BITLINE-SELECTION VOLTAGE

(71) Applicant: STMicroelectronics S.r.l., Agrate Brianza (IT)

(72) Inventors: Marcella Carissimi, Treviolo (IT); Laura Capecchi, Vedano al Lambro (IT); Marco Pasotti, Travaco' Siccomario (IT); Fabio Enrico Carlo Disegni, Spino d'adda (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 16/931,335

(22) Filed: Jul. 16, 2020

(65) Prior Publication Data
US 2021/0020237 A1 Jan. 21, 2021

(30) Foreign Application Priority Data
Jul. 17, 2019 (IT) .......................... 102019000012153

(51) Int. Cl.
*G11C 7/02* (2006.01)
*G11C 13/00* (2006.01)

(52) U.S. Cl.
CPC .......... *G11C 13/004* (2013.01); *G11C 13/003* (2013.01); *G11C 13/0004* (2013.01); *G11C 13/0026* (2013.01); *G11C 13/0028* (2013.01); *G11C 2013/0045* (2013.01)

(58) Field of Classification Search
CPC .............. G11C 13/004; G11C 13/0004; G11C 13/0026
USPC ........................................................... 365/207
See application file for complete search history.

(56) References Cited

U.S. PATENT DOCUMENTS

| | | | |
|---|---|---|---|
| 2003/0132872 A1* | 7/2003 | Casper | H03F 3/45672 341/161 |
| 2014/0177319 A1 | 6/2014 | Park | |
| 2017/0365336 A1* | 12/2017 | Lin | G11C 13/004 |
| 2018/0068721 A1 | 3/2018 | Calvetti et al. | |

* cited by examiner

*Primary Examiner* — Vu A Le
(74) *Attorney, Agent, or Firm* — Slater Matsil, LLP

(57) ABSTRACT

A sense amplifier and a method for accessing a memory device are disclosed. In an embodiment a sense amplifier for a memory device includes a first input node selectively coupled to a first memory cell through a first local bitline and a first main bitline, a second input node selectively coupled through a second local bitline and a second main bitline to a second memory cell or to a reference generator configured to generate a reference current, a first current generator controllable so as to inject a first variable current into the first input node, a second current generator controllable so as to inject a second variable current into the second input node, a first branch coupled to the first input node and comprising a first switch circuit, a first sense transistor and a first forcing transistor and a second branch coupled to the second input node and including a second switch circuit, a second sense transistor and a second forcing transistor.

18 Claims, 7 Drawing Sheets

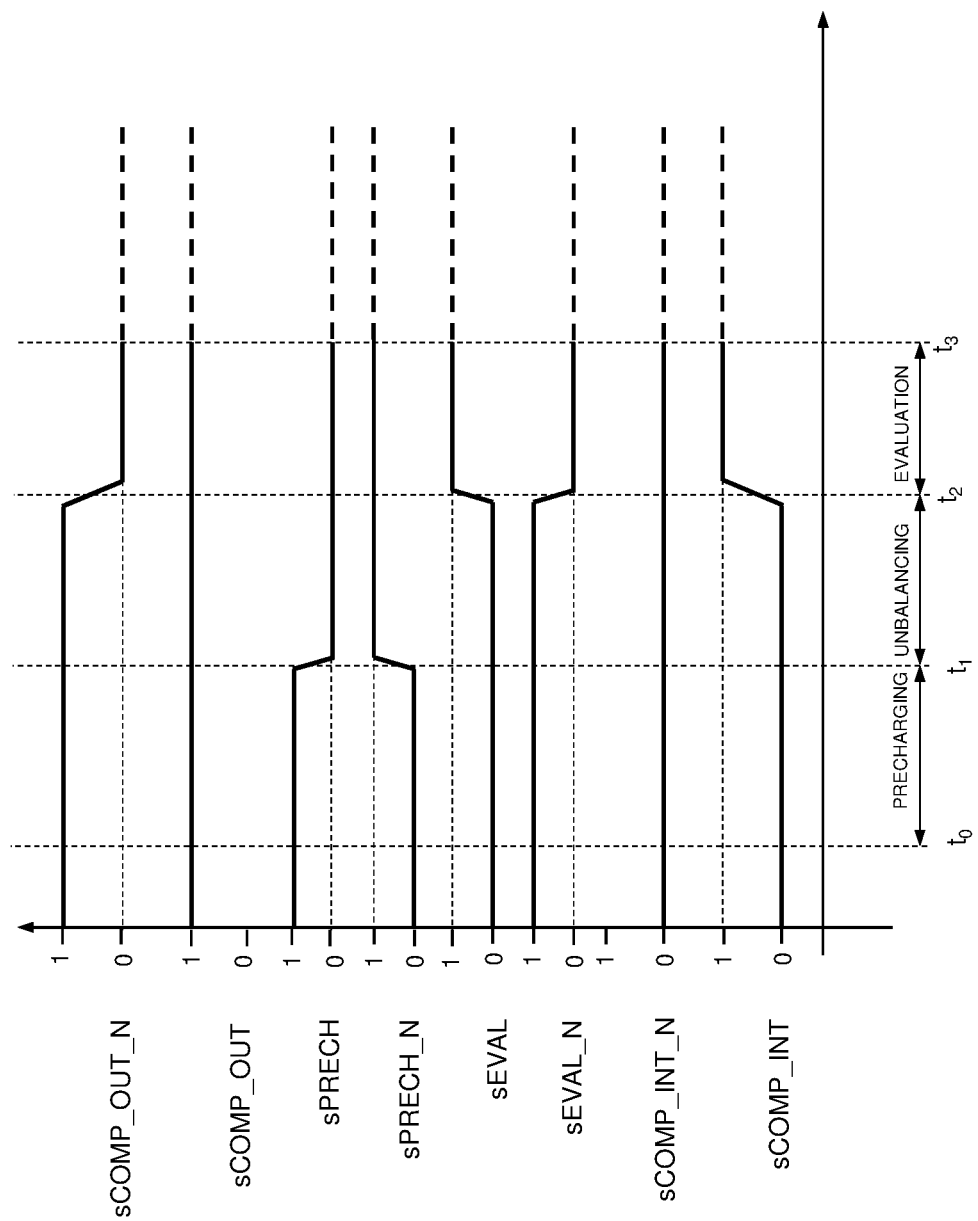

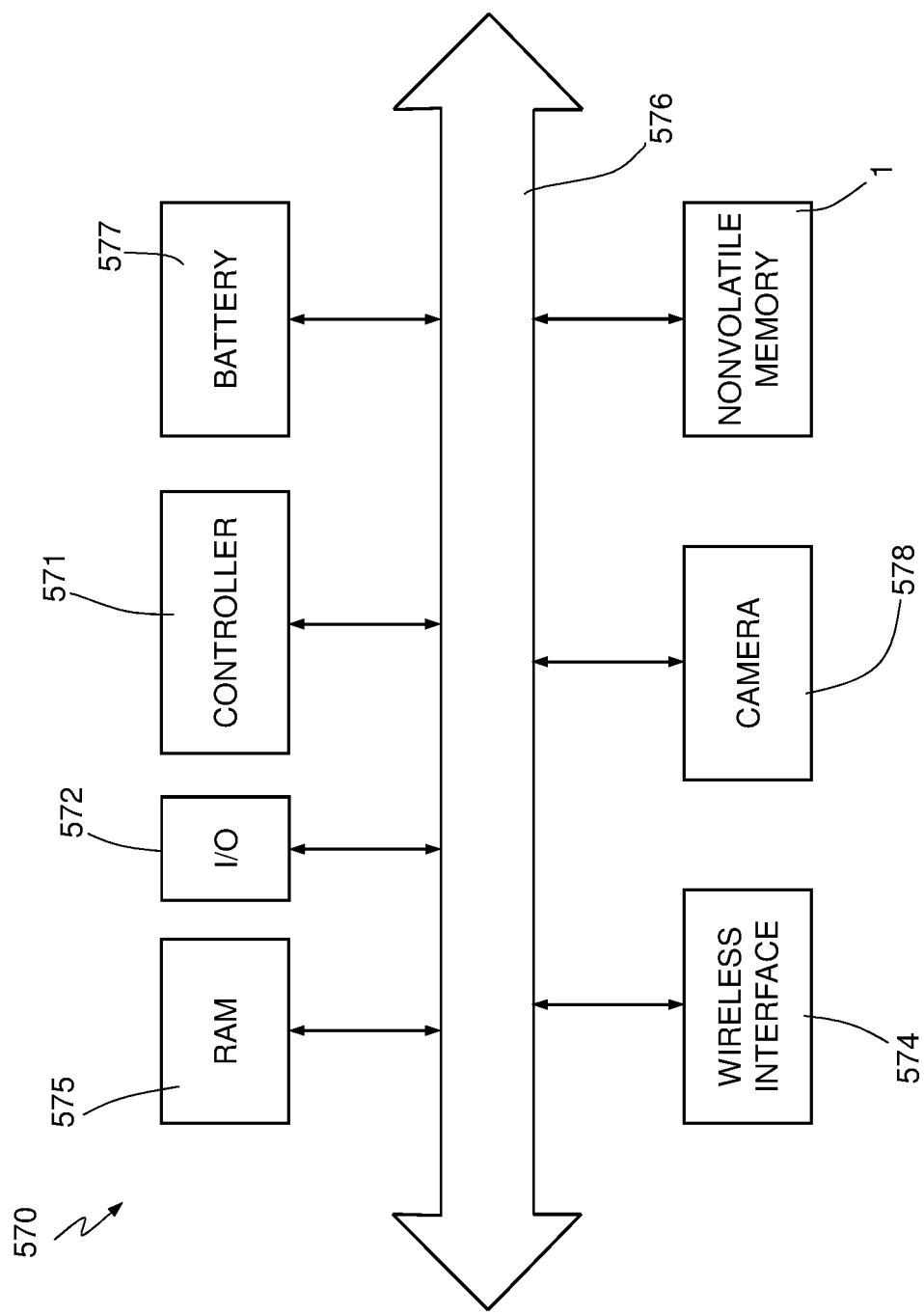

LATCH-TYPE SENSE AMPLIFIER FOR A NON-VOLATILE MEMORY WITH REDUCED MARGIN BETWEEN SUPPLY VOLTAGE AND BITLINE-SELECTION VOLTAGE

CROSS-REFERENCE TO RELATED APPLICATIONS

This application claims priority to Italian Patent Application No. 10 2019 000012153, filed on Jul. 17, 2019, which application is hereby incorporated herein by reference.

TECHNICAL FIELD

The present invention relates to a sense amplifier of a latch type for a non-volatile memory with reduced voltage margin between the supply voltage and the bitline-selection voltage.

BACKGROUND

As is known, various types of non-volatile memories are available today, such as, for example, phase-change memories (PCMs), where the characteristics of materials having the property of switching between phases with a different electrical behaviour are exploited for storing information. These materials can switch between a disorderly/amorphous phase and an orderly crystalline or polycrystalline phase. Different phases are characterised by different values of resistivity and are consequently associated with different values of a datum stored. For instance, the elements of Group VI of the periodic table, such as tellurium (Te), selenium (Se) or antimony (Sb), also known as chalcogenides or chalcogenic materials, can be used for manufacturing phase-change memory cells. In particular, an alloy formed by germanium (Ge), antimonium (Sb), and tellurium (Te), known as GST (having the chemical composition $Ge_2Sb_2Te_5$), is currently widely used in such memory cells.

The phase changes can be obtained by locally increasing the temperature of the cells of chalcogenic material, through resistive electrodes (known in general as heaters) set in contact with corresponding regions of chalcogenic material.

Access (or selection) devices, (for example bipolar or MOS transistors), are connected to the heaters and selectively enable the passage of a programming electric current (also known as write electric current) through them. This electric current, by the Joule effect, generates the temperature required for phase change, and in particular for switching from a high-resistivity state (known as RESET state) to a low-resistivity state (the so-called SET state) or vice versa.

During reading, the state of the chalcogenic material is detected by applying a voltage that is sufficiently low so as not to cause a sensitive heating thereof, and then reading the value of the current that flows in the memory cell through a sense amplifier. Given that the current is proportional to the conductivity of the chalcogenic material, it is possible to determine in what state the material is in and consequently determine the datum stored in the memory cell.

SUMMARY

Embodiments provide a sense amplifier and a method for operating for accessing a memory device as noted below.

FIG. 1 shows a non-volatile storage device 1 comprising a memory array 2 formed by a plurality of memory cells 3, arranged in rows, or wordlines WL, and columns, or bitlines, the latter also being known as local bitlines LBL.

Each memory cell 3 is formed by a storage element 3a and by an access element 3b, which are connected together in series between a respective local bitline LBL and a terminal at the reference potential (for example ground, GND). A wordline WL is defined by the set of all the control terminals of the access elements 3b aligned a same identical row.

The storage element 3a includes an element of phase-change material (for example, a chalcogenide, such as GST) and is consequently able to store data in the form of levels of resistance associated with the various phases assumed by the material itself.

The access element 3b is, for example, an N-channel MOS transistor having its gate terminal connected to a respective wordline WL. Its drain terminal is connected to a first terminal of the storage element 3a, and its source terminal is connected to the terminal at the reference potential. A second terminal of the storage element 3a is connected to a corresponding local bitline LBL. The access element 3b is controlled and biased so as to enable, when selected, the passage of a read current, or of a write current, through the storage element 3a.

A column decoder 4 and a row decoder 5 enable selection of the memory cells 3, on the basis of address signals received, at input, (designated as a whole by AS) and more or less complex decoding schemes. The address signals AS can be generated by a control logic CL, which moreover governs the column decoder 4 and the row decoder 5 so as to enable reading and writing (SET and RESET) of the memory cells 3 addressed by the address signals AS. Albeit not illustrated, the control logic CL also supplies control signals to the column decoder 4 and to the row decoder 5, in order to control the aforementioned read/writing operations.

In particular, the column decoder 4 and the row decoder 5 enable selection of the wordlines WL and of the local bitlines LBL addressed, and therefore enable bias at appropriate voltage values of the wordlines WL and local bitlines LBL selected.

The column decoder 4 is furthermore configured to internally implement two distinct paths towards the local bitlines LBL of the memory array 2 each time selected: a reading path, designed to selectively create a conductive path between each selected local bitline LBL and a read stage 7, which includes a plurality of sense amplifiers, and a writing path, designed to selectively create a conductive path between each selected local bitline LBL and a write stage 8 configured to supply the currents required for the writing operations, i.e., for the so-called programming of the memory cells in corresponding logic states, and therefore for storage of information. For this purpose, the column decoder 4 comprises, for each reading and programming path, appropriate selection elements (in particular, controlled transistors), connected so as to implement an address-decoding system, which is typically hierarchical, for selection of the memory cells 3.

As illustrated schematically in FIG. 2, typically the memory array 2 is organised in a plurality of sectors S, each of which comprises a plurality of memory cells 3.

Each sector S is associated with a corresponding portion (designated by 5a) of the row decoder 5 where the respective wordlines WL arrive. Moreover, each sector S includes a plurality of respective wordlines WL and respective local bitlines, designated once again by LBL and distinct from those of the other sectors, which are physically connected to the memory cells 3 present in the sector S itself. In addition, for each set of a number K of local bitlines LBL (in FIG. 2, K=4), two main bitlines MBL are provided: one for reading, denoted by MBLr, and one for writing, denoted by MBLw. In general, variants are, however, possible where reading and writing do not require different main bitlines.

The local bitlines LBL of each sector S are specific for that sector S, i.e., they are not shared between different sectors S. Instead, the main bitlines MBL can be shared between two or more sectors, as shown in FIG. 2, which shows a main read bitline MBLr and a main write bitline MBLw, which are shared between the two sectors S visible in FIG. 2, i.e., they can be electrically coupled to local bitlines LBL of both of the sectors S, provided that this does not occur simultaneously.

As mentioned previously and illustrated in FIG. 3, memories are known in which each local bitline LBL can be connected to a respective main read bitline MBLr and to a respective main write bitline MBLw, respectively, via a first MOS switch 10P and a second MOS switch 10N, of a P type and an N type, respectively.

In practice, the MOS switches 10P, 10N implement a first level of a hierarchical decoding system implemented by the column decoder 4, which moreover comprises a pair of further decoding circuits, respectively a read circuit 12 and a write circuit 13, which implement a second level of the hierarchical decoding system.

In particular, the read decoding circuit 12 is connected to the main read bitlines MBLr, whereas the write decoding circuit 13 is connected to the main write bitlines MBLw. Moreover, the read decoding circuit 12 can be controlled so as to selectively couple the main read bitlines MBLr to the read stage 7, whereas the write decoding circuit 13 can be controlled so as to selectively couple the main write bitlines MBLw to the write stage 8.

During reading, the MOS switches ioP are controlled by sets of so-called first-level bias signals, typically denoted by YO<i:K>, where K is the number of local bitlines associated with a single main read bitline MBLr. In other words, the first-level bias signals YO<1:K> control the connections between the local bitlines LBL and the corresponding main read bitlines MBLr. Moreover, albeit not illustrated, the connections between the main read bitlines MBLr and the read stage 7 are controlled by second-level bias signals, typically designated by YM.

In practice, considering a selected local bitline LBL and a corresponding selected memory cell 3, i.e., the memory cell 3 connected to the aforesaid selected local bitline LBL and to the selected wordline WL, the read decoding circuit 12, the corresponding main read bitline MBLr, and the second MOS switch 10N form a reading path that connects the selected memory cell 3 to the read stage 7.

In greater detail, the column decoder 4 comprises, for each sector S, at least a respective first-level decoding circuit ii for the reading operations and for the writing operations, which is coupled to the respective local bitlines LBL and can be activated for selecting said local bitlines LBL.

Moreover, the column decoder 4 comprises, for each set of sectors S, a respective second-level decoding circuit 14, once again for the reading operations and writing operations, which is coupled to the respective main bitlines MBL and can be activated for selecting the latter.

In turn, each first-level decoding circuit 11 comprises a respective first-level subcircuit 11a for the reading operations and a respective first-level subcircuit 11b for the writing operations. Likewise, each second-level decoding circuit 14 comprises a respective second-level subcircuit 14a for the reading operations and a respective second-level subcircuit 14b for the writing operations. For instance, the first-level subcircuits 11a for the reading operations and the first-level subcircuits 11b for the writing operations comprise, respectively, the second and the first MOS switches 10N, 10P. Moreover, the second-level subcircuits 14a for the reading. operations and the second-level subcircuits 14b for the writing operations form, respectively, the read decoding circuit 12 and the programming decoding circuit 13.

Considering any of the aforementioned sets of K local bitlines LBL of a sector S, the first-level subcircuit 11a for the reading operations coupled to said sector S can be controlled electrically, by the first-level bias signals YO<i:K>, so as to electrically couple, each time, one of the K local bitlines LBL (in particular, the local bitline selected) to the corresponding main read bitline MBLr. Moreover, the second-level subcircuit 14a for the reading operations can be controlled electrically, by the second-level bias signals YM, so as to electrically couple the main read bitline MBLr to the read stage 7. Coupling to the read stage 7 enables bias of the main read bitline MBLr selected and the local bitline LBL selected. Similar considerations apply to the first-level subcircuit 11b for the writing operations coupled to the aforesaid sector S, which couples the main write bitline MBLw selected to the write stage 8, which is also known as "program load".

As mentioned previously, the local bitlines LBL of each sector S are therefore specific for that sector S, i.e., they are not shared between different sectors S. Instead, the main bitlines MBL can be shared between two or more sectors, as shown precisely in FIG. 2, where a main read bitline MBLr and a main write bitline MBLw, which are shared between the two sectors S visible in FIG. 2, i.e., they can be connected to single selected local bitlines belonging to the corresponding two sets of four local bitlines LBL of the two sectors S illustrated. In this regard, with reference, for example, to the main read bitline MBLr illustrated in FIG. 2, in the read step the two first-level subcircuits 11a for the reading operations coupled to the two sectors S operate so that the aforesaid main read bitline MBLr is electrically coupled to just one of the 2·K local bitlines LBL of the corresponding two sets of K local bitlines LBL of the two sectors S. Similar considerations apply to the first-level subcircuits 11b for the writing operations that are coupled to the two sectors S illustrated in FIG. 2, and for the corresponding main write bitline MBLw, which in turn is coupled, during writing, to the programming stage 8.

All this having been said, the non-volatile storage device 1 may be of the so-called "single-ended" type, in which case the read stage 7 is configured to compare the current that circulates in the selected memory cell 3 with a reference current in order to determine the datum stored.

Alternatively, the non-volatile storage device 1 may be of a differential type, in which case the data are programmed in pairs of memory cells 3 so that the cells of each pair store opposite data, and the read stage 7 is configured to compare the currents that circulate in the memory cells 3 of the pair selected.

In greater detail, irrespective of whether the non-volatile storage device 1 is of a single-ended type or of a differential type, the read stage 7 includes, as mentioned previously, a plurality of sense amplifiers, each of which includes a first input and a second input. During reading, the first input of a sense amplifier is connected, in a way controlled by the column decoder 4, to a first selected memory cell 3, whereas the second input is connected to a second selected memory cell 3 (in the case of differential reading) or, alternatively, to a reference-current generator (in the case of single-ended reading). Moreover, the sense amplifier generates an output that depends upon the comparison between the current that flows in the first selected memory cell 3 and the current that flows in the second selected memory cell 3 or, alternatively, in the reference-current generator.

To be able to perform the aforementioned comparison, the sense amplifiers are connected to a supply voltage $V_{dd}$, which may be rather low, for example approximately equal to 1 Volt. Since currently the local bitlines LBL are biased, when selected, at a voltage typically approximately equal to 0.6 Volts, the sense amplifiers have an extremely small voltage margin available, which thus imposes a serious constraint on the choice of the components (in particular, MOSFETs transistors) that can be used for implementing the sense amplifiers.

Today there is therefore particularly felt the need to provide a sense amplifier that is able to operate also in the presence of a reduced margin between the supply voltage and the voltage present on the local bitlines LBL, when selected, the latter voltage also being known as the bitline-selection voltage.

BRIEF DESCRIPTION OF THE DRAWINGS

For a better understanding of the present invention, preferred embodiments thereof will now be described, purely by way of example non-limiting example, with reference to the attached drawings, wherein:

FIG. 6 shows examples of trend over time of signals generated within the present sense amplifier;

FIG. 9 shows a block diagram of an electronic apparatus that incorporates a memory device that includes the present sense amplifier.

DETAILED DESCRIPTION OF ILLUSTRATIVE EMBODIMENTS

Figure 1:
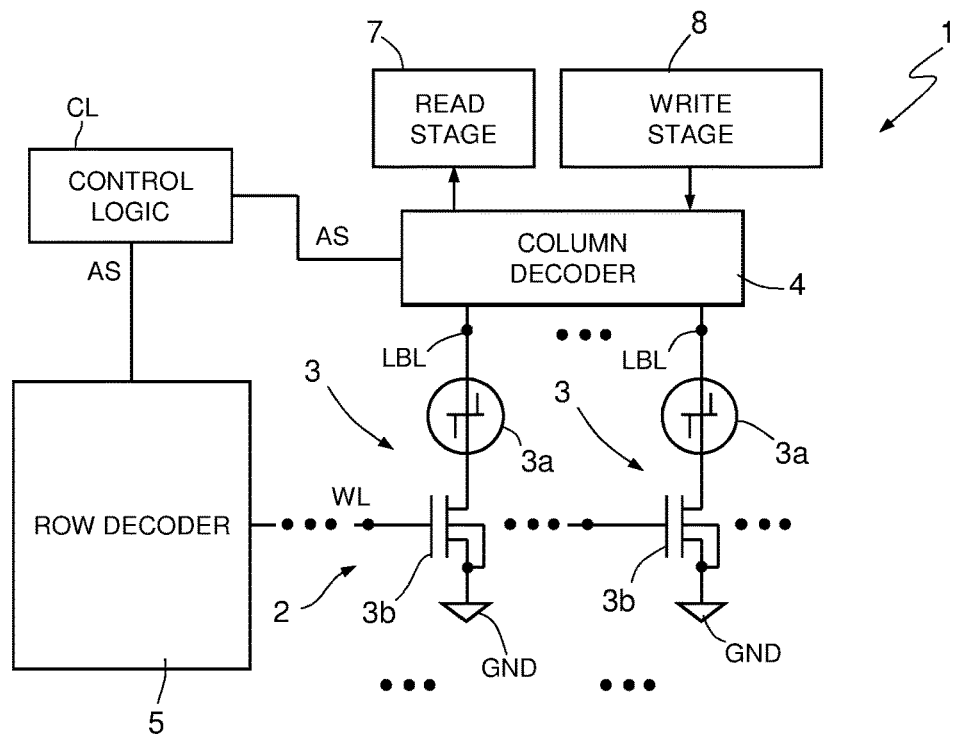
FIG. 1 shows a block diagram of a PCM device.
Figure 2:
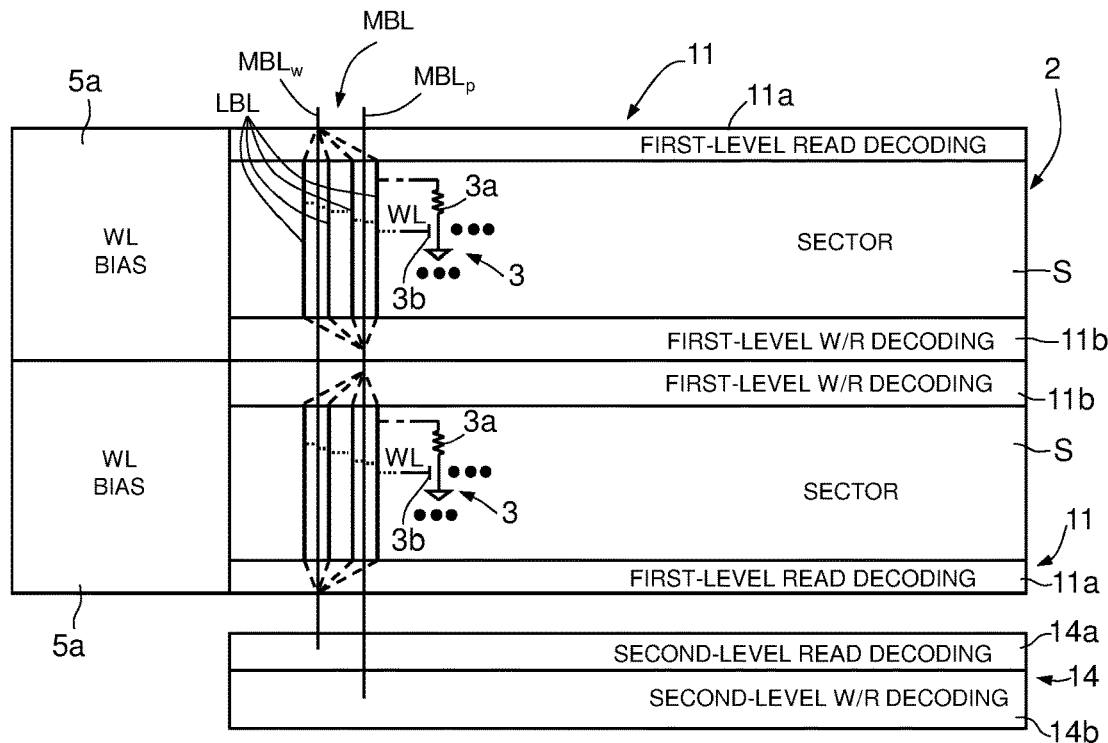
FIGS. 2 and 3 show block diagrams of portions of PCM devices.
Figure 3:
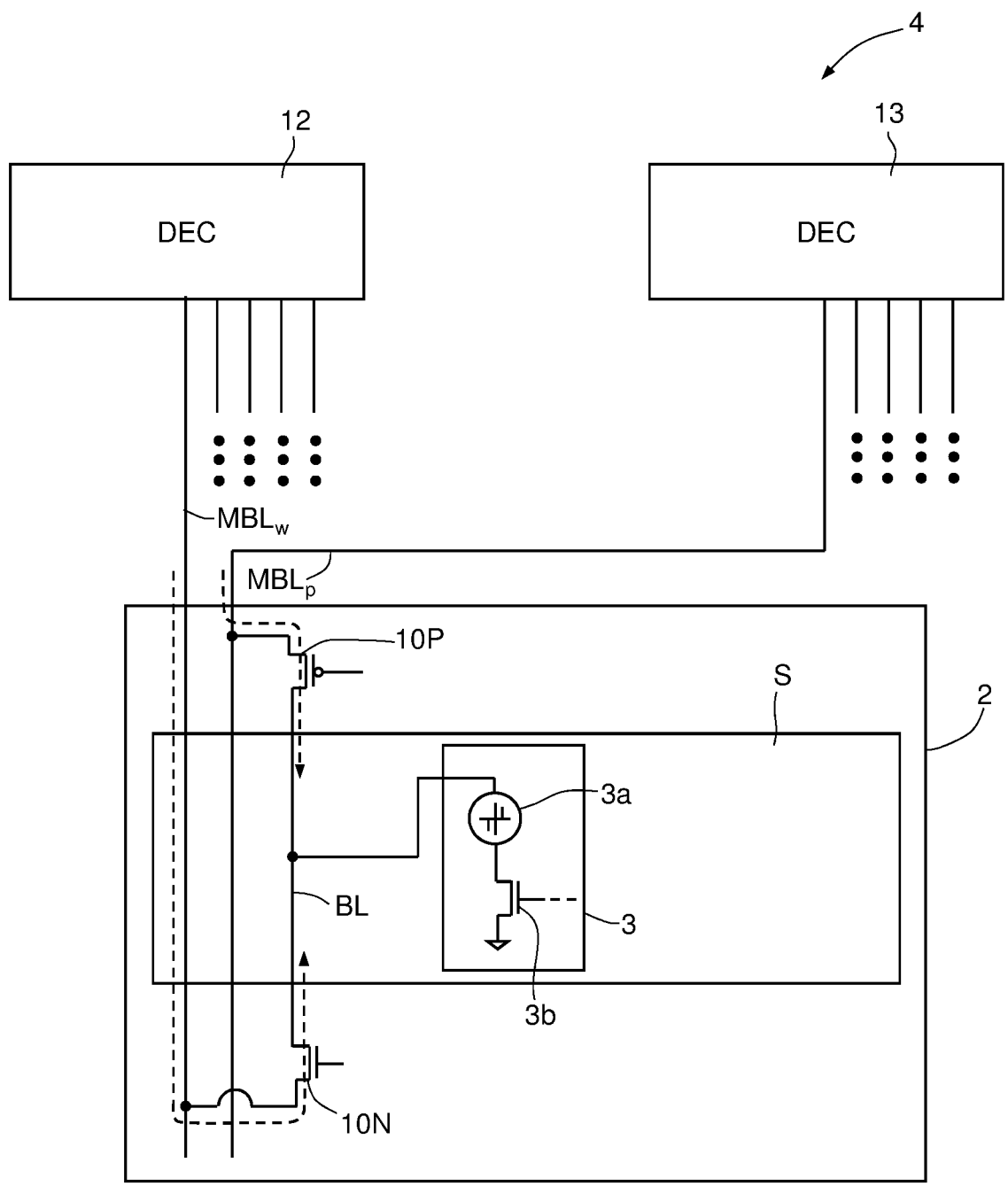
Figure 4:
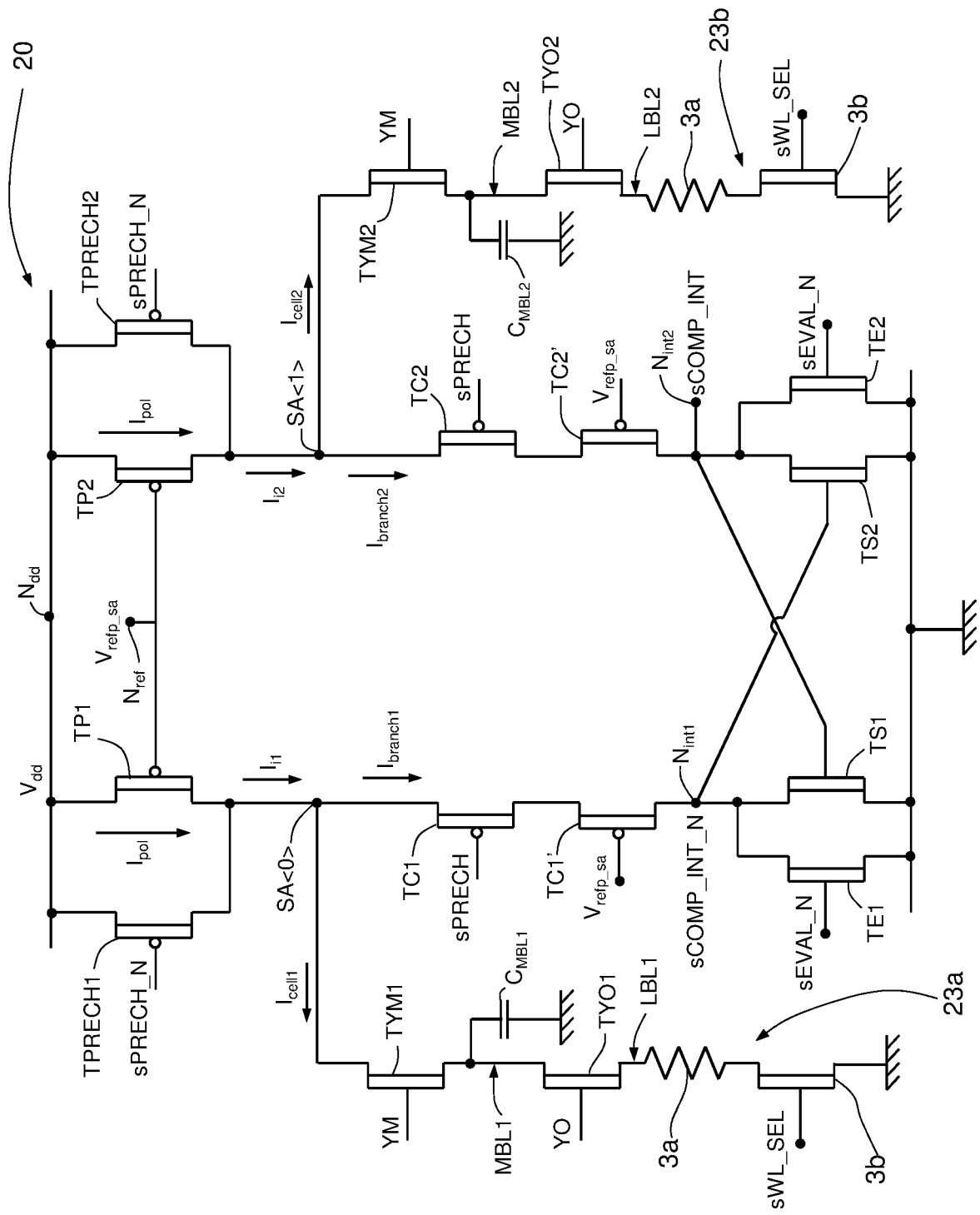
FIGS. 4 and 5 show circuit diagrams of parts of the present sense amplifier.

FIG. 4 shows a sense amplifier 20, which, purely by way of example, can be implemented in the read stage 7 of the non-volatile storage device 1 illustrated in FIG. 1.

In detail, the sense amplifier 20 can be coupled to a first memory cell and a second memory cell (designated, respectively, by 23a and 23b) and includes a first bias transistor TP1 and a second bias transistor TP2 and a first precharge transistor TPRECH1 and a second precharge transistor TPRECH2, which are P-channel enhancement-mode transistors and are, for example, the same as one another.

The source terminals of the first and the second bias transistors TP1, TP2 and of the first and the second precharge transistors TPRECH1, TPRECH2 are connected to a supply node $N_{dd}$, which in use is set at a supply voltage $V_{dd}$, for example, equal to 1 Volt. The gate terminals of the first and the second bias transistors TP1, TP2 are connected to a reference node $N_{ref}$, which is set at a reference voltage $V_{refp\_sa}$, as described in greater detail hereinafter. The drain terminals of the first bias transistor TP1 and of the first precharge transistor TPRECH1 are connected to one another and form a first input node SA<0>, whereas the drain terminals of the second bias transistor TP2 and of the second precharge transistor TPRECH2 are connected to one another and form a second input node SA<1>. In addition, as described in greater detail hereinafter, a signal sPRECH_N is present on the gate terminals of the first and the second precharge transistors TPRECH1, TPRECH2.

The sense amplifier 20 further comprises a first upper control transistor TC1 and a second upper control transistor TC2 and a first lower control transistor TC1' and a second lower control transistor TC2', which are P-channel enhancement-mode transistors and are, for example, the same as one another.

The first upper control transistor TC1 and the first lower control transistor TC1' are connected together in series. In particular, the source terminal of the first upper control transistor TC1 is connected to the first input node SA<0>, whereas the drain terminal of the first upper control transistor TC1 is connected to the source terminal of the first lower control transistor TC1', the drain terminal of which forms a first internal node $N_{int1}$. The source terminal of the second upper control transistor TC2 is connected to the second input node SA<1>, whereas the drain terminal of the second upper control transistor TC2 is connected to the source terminal of the second lower control transistor TC2', the drain terminal of which forms a second internal node $N_{int2}$. Moreover, as described in greater detail hereinafter, a signal sPRECH is present on the gate terminals of the first and the second upper control transistors TC1, TC2, which, as described hereinafter, is equal to the logical negation of the signal sPRECH_N. The aforementioned reference voltage Vrefp_sa is present on the gate terminals of the first and the second lower control transistors TC1', TC2'. Furthermore, in what follows the voltages present on the first and the second internal nodes $N_{int3}$, $N_{int2}$ are referred to, respectively, as signals sCOMP_INT_N and sCOMP_INT.

The sense amplifier 20 further comprises a first sense transistor TS1 and a second sense transistor TS2 and a first evaluation transistor TE1 and a second evaluation transistor TE2, which are of the N-channel enhancement-mode type, are the same as one another and have their source terminals connected to ground.

The drain terminals of the first sense transistor TS1 and of the first evaluation transistor TE1 are connected to the first internal node $N_{int1}$, whereas the drain terminals of the second sense transistor TS2 and of the second evaluation transistor TE2 are connected to the second internal node $N_{int2}$. The gate terminals of the first and the second sense transistors TS1, TS2 are connected, respectively, to the second internal node $N_{int2}$ and to the first internal node $N_{int1}$, and therefore, respectively, to the drain terminal of the second sense transistor TS2 and to the drain terminal of the first sense transistor TS1. In other words, the first and the second sense transistors TS1, TS2 are connected in a cross-coupled way. Moreover, as described in greater detail hereinafter, a signal sEVAL_N is present on the gate terminals of the first and the second evaluation transistors TE1, TE2.

The first input node SA<0> is coupled to the first memory cell 23a through a first first-level transistor TYO1 and a first second-level transistor TYM1, which are N-channel enhancement-mode transistors, are, for example, the same as one another and are connected together in series.

In particular, the drain terminal of the first second-level transistor TYM1 is connected to the first input node SA<0>, whereas the source terminal of the first second-level transistor TYM1 is connected to the drain terminal of the first first-level transistor TYO1, which electrically coincides with a first main bitline MBL1. The source terminal of the first first-level transistor TYO1 is connected to a first local bitline LBL1 and therefore also to the second terminal of the storage element 3a of the first memory cell 23a. Corresponding first-level and second-level bias signals, designated by YO and YM and generated, for example, by the column decoder 4, are present on the gate terminals of the first first-level transistor TYO1 and of the first second-level transistor TYM1.

The second input node SA<1> is coupled to the second memory cell 23b through a second first-level transistor TYO2 and a second second-level transistor TYM2, which are N-channel enhancement-mode transistors and are, for example, equal to the first first-level transistor TYO1 and to the first second-level transistor TYM1.

The second first-level transistor TYO2 and the second second-level transistor TYM2 are connected together in series. In particular, the drain terminal of the second second-level transistor TYM2 is connected to the second input node SA<1>, whereas the source terminal of the second second-level transistor TYM2 is connected to the drain terminal of the second first-level transistor TYO2, which electrically coincides with a second main bitline MBL2. The source terminal of the second first-level transistor TYO2 is connected to a second local bitline LBL2, and therefore also to the second terminal of the storage element 3a of the second memory cell 23b. The first-level bias signal YO and the second-level bias signal YM are present, respectively, on the gate terminals of the second first-level transistor TYO2 and of the second second-level transistor TYM2.

In practice, the first upper control transistor TC1, the first lower control transistor TC1', the first sense transistor TS1 and the first evaluation transistor TE1 form a first branch of the sense amplifier 20. Moreover, the second upper control transistor TC2, the second lower control transistor TC2', the second sense transistor TS2, and the second evaluation transistor TE2 form a second branch of the sense amplifier 20.

Figure 5:
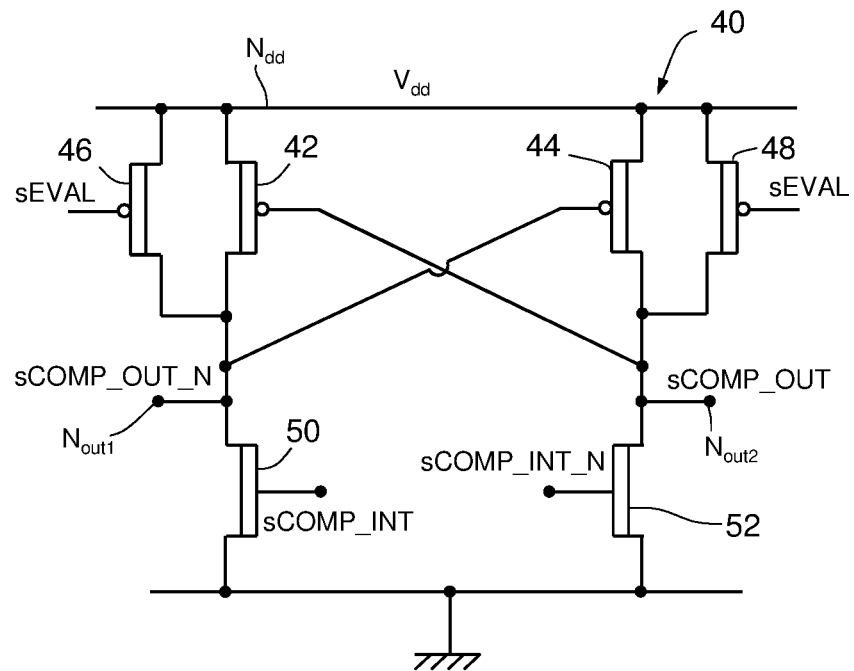

The sense amplifier 20 further comprises an intermediate stage 40, illustrated in FIG. 5.

In detail, the intermediate stage 40 comprises a first cross-coupled transistor 42 and a second cross-coupled transistor 44 and a first enable transistor 64 and a second enable transistor 48, which are P-channel enhancement-mode transistors and are, for example, the same as one another.

The source terminals of the first and the second cross-coupled transistors 42, 44 and of the first and the second enable transistors 46, 48 are connected to the supply node $N_{dd}$, and are therefore set at the supply voltage $V_{dd}$. The gate terminals of the first and the second cross-coupled transistors 42, 44 are connected, respectively, to the drain terminal of the second cross-coupled transistor 44 and to the drain terminal of the first cross-coupled transistor 42.

The source terminals of the first and the second enable transistors 46, 48 are connected to the supply node $N_{dd}$. The drain terminals of the first and the second enable transistors 46, 48 form, respectively, a first output node $N_{out1}$ and a second output node $N_{out2}$ and are connected, respectively, to the drain terminals of the first and the second cross-coupled transistors 42, 44. Moreover, a signal sEVAL, equal to the logical negation of the signal sEVAL_N is present on the gate terminals of the first and the second enable transistors 46, 48.

The intermediate stage 40 further comprises a first output transistor 50 and a second output transistor 52, which are N-channel enhancement-mode transistors and are, for example, the same as one another.

The drain and source terminals of the first output transistor 50 are connected, respectively, to the first output node $N_{out1}$ and to ground. The drain and source terminals of the second output transistor 52 are connected, respectively, to the second output node $N_{out\ 2}$ and to ground. Moreover, the gate terminals of the first and the second output transistors 50, 52 are connected, respectively, to the second internal node $N_{int2}$ and to the first internal node $N_{int1}$, so as to receive, respectively, the signal sCOMP_INT and the signal sCOMP_INT_N.

In what follows, the voltages present on the first output node $N_{out1}$ and on the second output node $N_{out2}$ are referred to, respectively, as the signal sCOMP_OUT_N and the signal sCOMP_OUT. Moreover, the pairs of logic values (sCOMP_INT, sCOMP_INT_N) and (sCOMP_OUT, sCOMP_OUT_N) are referred to, respectively, as the input state and the output state of the intermediate stage 40.

The signals sPRECH and sEVAL and the corresponding negations sPRECH_N and sEVAL_N can be generated by the control logic CL (FIG. 1) and can vary between 0 V and the supply voltage $V_{dd}$.

Limitedly to the read step, the signals sPRECH and sEVAL and the corresponding negations sPRECH_N and sEVAL_N have the trends illustrated in FIG. 6. These diagrams are described hereinafter, on the hypothesis that the bias signals of a first level YO and a second level YM are equal to '1' and are therefore equal to a voltage value such that the first and the second first-level transistors TYO1, TYO2 and the first and the second second-level transistors TYM1, TYM2 are in a condition of saturation. For instance, the voltages of the first-level and second-level bias signals YO, YM are comprised in a range between 1.2 and 1.4 V, and are therefore higher than the supply voltage $V_{dd}$. Furthermore, it is assumed, once again by way of example, that a voltage of 0.6 V is present on the first and the second local bitlines LBL1, LBL2. In addition, it is assumed that a signal WL SEL that enables said access elements 3b, i.e., that allows selection of the first and the second memory cells 23a, 23b, is present on the gate terminals of the access elements 3b of the first and the second memory cells 23a, 23b. In addition, it is assumed that the reference voltage $V_{refp\_sa}$ is such that, when the first and the second precharge transistors TPRECH1 and TPRECH2 are inhibited, the first and the second bias transistors TP1, TP2 operate in saturation and a bias current $I_{pol}$ equal to a value $I'_{pol}$ passes there through. As described hereinafter, the bias current $I_{pol}$ delivered by each of the first and the second bias transistors TP1, TP2 varies according to the particular steps of the reading procedure.

Albeit not shown, the reference node $N_{ref}$ and the first and the second bias transistors TP1, TP2 may form part of current mirrors that can be controlled, for example by the control logic CL and by interposition of a digital-to-analog converter (not illustrated), so as to impose the value $I'_{pol}$. Without this implying any loss of generality, in what follows it is assumed that the reference voltage $V_{refp\_sa}$ is such that the value $I'_{pol}$ is approximately equal to 30 µA. In general, the reference voltage $V_{refp\_sa}$ is comprised between ground and the supply voltage $V_{dd}$, e.g., the relation $0.1V < V_{refp\_sa} < (V_{dd}-0.3V)$ applies.

This having been said, initially the sense amplifier 20 is controlled by the control logic CL so as to carry out a precharging step.

In particular, at an instant t., the signal sEVAL is equal to '0', and therefore has a null voltage, whereas the signal sPRECH has the value '1', and therefore is equal to the supply voltage $V_{dd}$. Consequently, at the instant $t_o$, the signal sPRECH_N is '0'. Therefore, the first and the second precharge transistors TPRECH1 and TPRECH2 operate in linear region and a precharge current Iprech passes there through. Also the first and the second bias transistors TP1, TP2 operate in linear region. Moreover, the bias current $I_{pol}$ is equal to a value $I''_{pol}$, lower than the precharge current $I_{prech}$. The precharge current $I_{prech}$ is, for example, of the order of 100 µA and is in any case higher than the value $I'_{pol}$.

A first injected current $I_{i1}$ and a second injected current $I_{i2}$, which are both equal to the sum (in what follows designated by I*) of the bias current $I_{pol}$ and the precharge current $I_{prech}$, are therefore injected, respectively, into the first and the second input nodes SA<0>, SA<1>.

Once again at the instant $t_o$, the first and the second upper control transistors TC1, TC2 are inhibited. Also the first and the second lower control transistors TC1', TC2' are inhibited.

Moreover, if we designate the currents that flow, respectively, in the first and in the second memory cells 23a, 23b with $I_{cell1}$ and $L_{cell2}$, they are equal to $I''_{pol}+I_{prech}$ and charge respectively, during a transient of negligible duration, a capacitance (designated by $C_{MBL1}$), formed by the first main bitline MBl1 and a capacitance (designated by $C_{MBL2}$) formed by the second main bitline MBL2. In practice, the first and the second main bitlines MBl1, MBL2, which are associated with capacitances that are much higher than those associated with the local bitlines, are charged.

In addition, at the instant to, the signals sEVAL_N are equal to '1', and therefore the first and the second evaluation transistors TE1, TE2 operate in linear region, and consequently discharge, i.e., force to ground, the first and the second internal nodes $N_{int1}$, $N_{int2}$. Consequently, the signals sCOMP_INT and sCOMP_INT_N are equal to '0.' This means that the first and the second sense transistors TS1, TS2 are off.

Since the signals sCOMP_INT and sCOMP_INT_N are equal to '0', the first and the second output transistors 50, 52 of the intermediate stage 40 are inhibited. Moreover, since sEVAL is equal to '0', the first and the second enable transistors 46, 48 are above the threshold and force the logic values of the signals sCOMP_OUT and sCOMP_OUT_N to '1'. Consequently, the first and the second cross-coupled transistors 42, 44 are below the threshold.

At a subsequent instant t1, the signals sPRECH and sPRECH_N switch, causing the precharging step to end. In particular, the signal sPRECH_N goes to '1', and this leads to switching-off of the first and the second precharge transistors TPRECH1 and TPRECH2, and therefore also of the corresponding precharge currents Iprech. Instead, the signals sEVAL and sEVAL_N remain, respectively, equal to '0' and to Consequently, the first and the second internal nodes $N_{int1}$, $N_{int2}$ remain at ground, and therefore the signals sCOMP_INT and sCOMP_INT_N remain equal to '0', while the signals sCOMP_OUT and sCOMP_OUT_N remain equal to '1'.

The fact that, at the instant t1, the signal sPRECH becomes equal to '0' means that the first and the second upper control transistors TC1, TC2 switch on and start to operate in saturation. Also the first and the second lower control transistors TC1', TC2' switch on and start to operate in saturation.

In the abovementioned conditions, the currents $I_{cell1}$ and $I_{cell2}$ that flow, respectively, in the first and the second memory cells 23a, 23b depend upon the values of resistance of the respective storage elements 3a, and therefore upon the data stored. Moreover, a current $I_{branch1}$ equal to $I'_{pol}-I_{cell1}$, flows in the first upper control transistor TC1, whereas a current $I_{branch2}$ equal to $I'_{pol}-I_{cell2}$, flows in the second upper control transistor TC2. For instance, assuming that the first and the second memory cells 23a, 23b are, respectively, in the SET state and in the RESET state, we have $L_{cell1}>I_{cell2}$ and therefore $I_{branch1}<I_{branch2}$. FIG. 6 refers to this hypothesis.

In practice, the instant t1 marks the start of an unbalancing step, where the first branch of the sense amplifier 20, and in particular the first upper control transistor TC1 and the first lower control transistor TC1', is traversed by a current ($I_{branch1}$) other than the current ($I_{branch2}$) that flows in the second branch, and therefore in the second upper control transistor TC2 and in the second lower control transistor TC2', while the signals sCOMP_INT and sCOMP_INT_N are again forced to '0'.

At a subsequent instant t2, signals sEVAL and sEVAL_N switch, so as to cause the start of an evaluation step. Purely by way of example, in FIG. 6 an instant t3 is moreover indicated, to mark a final instant of the evaluation step.

In particular, at the instant t2, the signal sEVAL_N goes to and this leads to switching-off of the first and the second evaluation transistors TE1, TE2, which kept at ground the first and the second internal nodes $N_{int1}$, $N_{int2}$, the voltages (i.e., the signals sCOMP_INT_N and sCOMP_INT) of which therefore become free to vary.

In detail, the currents $I_{branch1}$ and $I_{branch2}$ charge, respectively, the first and the second internal nodes $N_{int1}$, $N_{int2}$, the voltages of which therefore tend to increase with different timings. In particular, in the present example, the voltage on the second internal node $N_{int2}$ tends to increase more rapidly than the voltage on the first internal node $N_{int1}$ since $I_{branch2}>I_{branch}$.

Since the voltages on the first and on the second internal nodes $N_{int1}$, $N_{int2}$ control, respectively, the gate terminals of the second sense transistor TS2 and of the first sense transistor TS1, the voltage that rises faster switches on the corresponding controlled transistor, thus forcing the other voltage to zero. In particular, in the present example, the rise in the voltage on the second internal node Nint2 switches on the first sense transistor TS1, which sets the first internal node $N_{int1}$ to ground.

In practice, once the signals sCOMP_INT_N and sCOMP_INT are left free to vary, they evolve towards a sensed state, where they assume complementary logic values (in the present example, respectively '0' and '1'), this sensed state being, precisely, a function of the logic values stored in the first and the second memory cells 23a, 23b.

In other words, switching-off of the first and the second evaluation transistors TE1, TE2 enables evolution of the voltages present, respectively, on the first and the second internal nodes $N_{int1}$, $N_{int2}$.

In greater detail, the first and the second upper control transistors TC1, TC2 represent negligible resistances. Moreover, the first and the second lower control transistors TC1', TC2' have values of impedance lower than the values of impedance of the first and the second bias transistors TP1, TP2, and therefore impose, to a first approximation, the impedance seen, respectively, by the current $T_{branch1}$ and by the current $T_{branch2}$.

Moreover, with reference for brevity to just the first lower control transistor TC1' (similar considerations likewise apply for the second lower control transistor TC2'), its presence causes the impedance seen by the current $T_{bronch1}$ to remain substantially constant during the evaluation step (sEVAL_N='0'), as the voltages of the first and the second internal nodes $N_{int1}$, $N_{int2}$ vary, enabling an improvement of the sensitivity of the sense amplifier 20.

As mentioned previously, the sensed state acts as input state for the intermediate stage 40. Consequently, once the aforementioned sensed state has been reached by the signals sCOMP_INT_N and sCOMP_INT, the output state of the intermediate stage 40 evolves, starting from ('1', '1'), towards a condition in which the two logic values are complementary. For instance, assuming that the signal sCOMP_INT is equal to '1' and the signal sCOMP_INT_N is equal to '0', and therefore that the input state of the intermediate stage '40' is equal to ('1', '0'), the first output transistor 50 switches on and sends the first output node $N_{out1}$ to ground. Consequently, the signal sCOMP_OUT_N passes to '0', while the second output transistor 52 remains inhibited and the signal sCOMP_OUT remains at '1'. Moreover, since the signal sEVAL has assumed the value '1', the first and the second enable transistors 46, 48 drop below the threshold. In addition, while the first cross-coupled transistor 42 remains inhibited, the second cross-coupled transistor 44 switches on and operates in saturation.

In other words, at the instant $t_2$, passage of the signals sCOMP_INT and sCOMP_INT_N from the state ('0', '0') (precharge state) to the state ('1', '0') (sensed state) entails passage of the signals sCOMP_OUT and sCOMP_OUT_N of the intermediate stage 40 from the state ('1', '1') to the state ('1', '0'). Likewise, in the case where the sensed state of the signals sCOMP_INT and sCOMP_INT_N were ('0', '1'), there would occur passage of the signals sCOMP_OUT and sCOMP_OUT_N of the intermediate stage 40 from ('1', '1') to ('0', '1'). Furthermore, the signals sCOMP_OUT and sCOMP_OUT_N have dynamics that substantially extend over the entire range [0-$V_{dd}$], unlike the signals sCOMP_INT and sCOMP_INT_N, the dynamics of which are more limited, on account of the voltage drop that occurs between the source and drain terminals of the first and the second bias transistors TP1, TP2.

Figure 7:
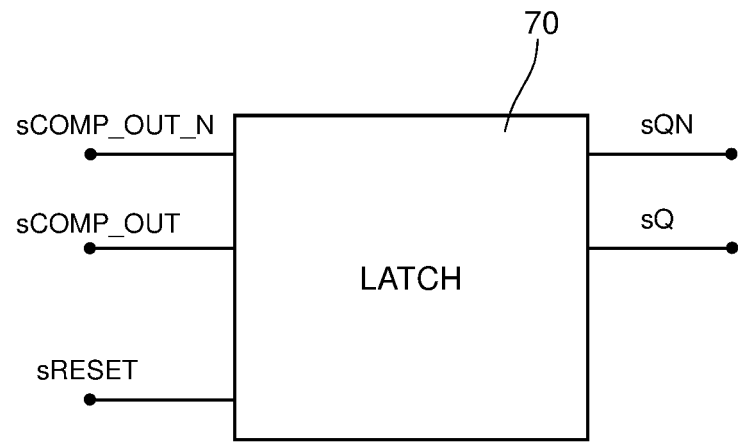
FIG. 7 shows a block diagram of a further part of the present sense amplifier.

As illustrated in FIG. 7, the sense amplifier 20 further comprises a latch circuit 70, which has a first input and a second input, which are connected, respectively, to the first and the second output nodes $N_{out1}$, $N_{out2}$, so as to receive, respectively, the signal sCOMP_OUT_N and the signal sCOMP_OUT. Moreover, the latch circuit 70 has a third input, on which it receives a signal sRESET, generated, for example, by the control logic CL, and a first output and a second output, on which it generates a signal sQ and a signal sQN, which are complementary to one another.

In detail, the latch circuit 70 can be implemented in a per se known manner, so that the pair (sQ, sQN) is equal to ('1', '0') and to ('0', '1') when the pair (sCOMP_OUT, sCOMP_OUT_N) is, respectively, equal to ('1', '0') and to ('0', '1'). Moreover, when the pair (sCOMP_OUT, sCOMP_OUT_N) assumes the value ('1', '1'), for example during precharging, the latch circuit 70 operates in conditions of storage, i.e., the pair (sQ, sQN) maintains the last pair of complementary values assumed. The condition (sCOMP_OUT, sCOMP_OUT_N)=('0', '0') represents, instead, a forbidden input condition. In a per se known manner, the latch circuit 70 can have a ground different from the ground referred to previously and can be supplied with a voltage different from the supply voltage $V_{dd}$.

In practice, the latch circuit 70 makes it possible to have available the pair of signals (sQ, sQN) indicating the reading made previously also during the precharging step of the next reading operation.

Figure 8:
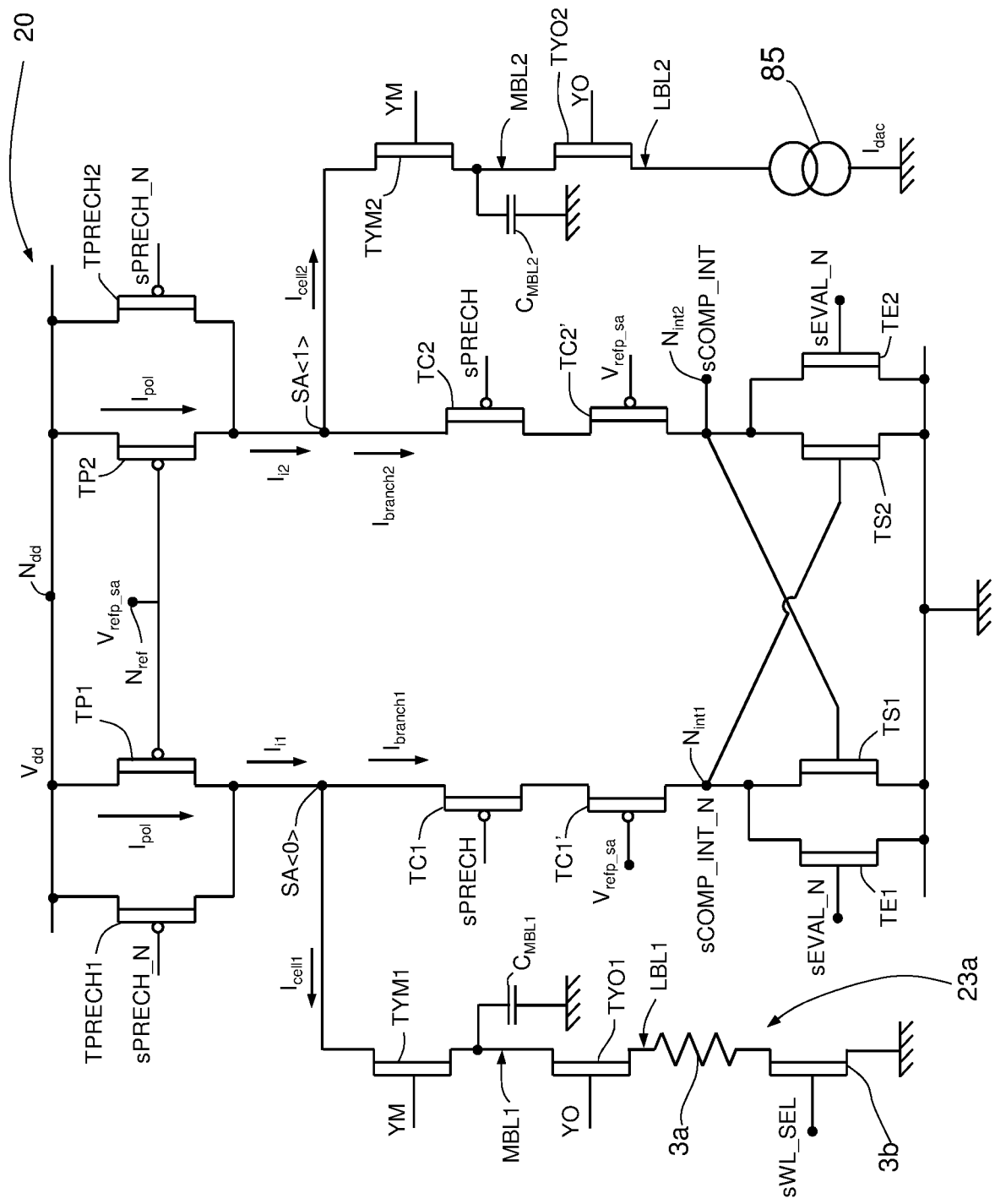
FIG. 8 shows a circuit diagram of the part of the present sense amplifier already illustrated in FIG. 4, in a different operating mode.

As illustrated in FIG. 8, the sense amplifier 20 can be used also in the case of reading of a single-ended type, instead of a differential type. For instance, in this case, the source terminal of the second first-level transistor TYO2 is connected, instead of to the second memory cell 23b, to a reference-current generator 85, which generates a reference current $I_{dac}$, which plays a role similar to that of the aforementioned current $I_{cell2}$.

In this case, the reference voltage $V_{refp\_sa}$ is such that the value $I'_{pol}$ is equal, for example, to $I_{dac}+10$ μA. The sense amplifier 20 behaves in the same way as described with reference to differential reading.

For practical purposes, the non-volatile storage device 1, when it includes one or more sense amplifiers 20, can find use in numerous contexts. For instance, FIG. 9 illustrates a portion of an electronic apparatus 57o, which may, for example, be: a PDA (Personal Digital Assistant), a portable or desktop computer, possibly with capacity of wireless data transfer, a mobile phone, a digital audio player, a camera or a camcorder, or further devices capable of processing, storing, transmitting, and receiving information.

In detail, the electronic apparatus 570 comprises: a controller 571 (for example, provided with a microprocessor, a DSP or a microcontroller), an input/output device 572 (for example, provided with a keypad and a display), for input and display of data, the non-volatile storage device 1, a wireless interface 574, for example an antenna, for transmitting and receiving data through a radiofrequency wireless communication network and a RAM 575. All the components of the electronic apparatus 570 are coupled through a bus 576. A battery 577 can be used as electrical power supply source in the electronic apparatus 57o, which may moreover be equipped with a camera, or video camera or camcorder 578. Moreover, the controller 571 can control the non-volatile storage device 1, for example co-operating with the control logic CL.

The advantages that the present sense amplifier affords emerge clearly from the foregoing description. In particular, the present sense amplifier can operate also in the presence of a reduced voltage between the supply voltage $V_{dd}$ and the voltage present on the local bitlines, when they are selected.

In addition, the presence of two transistors connected to ground and connected to one another in a cross-coupled way (in the case in point, the first and the second sense transistors TS1, TS2) means that reading is less sensitive to noise since it depends upon a sort of integration over time of the currents $I_{pol}$-$I_{cell1}$ and $I_{pol}$-$I_{cell2}$.

Moreover, the present sense amplifier resorts to a single reference voltage ($V_{refp\_sa}$), with consequent advantages in terms of accuracy of reading and simplicity of implementation. By varying said reference voltage, it is possible to adapt the sense amplifier to types of memory cells with different values of read current.

In addition, the intermediate stage 40 guarantees provision of all the dynamics possible and of a fast switching.

Finally, the present sense amplifier enables maximisation of reading of the differential signal or of the cell read in single-ended mode, thanks to sharing of the current signal between the bias transistors and the lower control transistors.

In addition, it is clear that modifications and variations may be made to what has been described and illustrated herein, without, thereby, departing from the scope of the present invention, as defined in the annexed claims.

For instance, the present sense amplifier is irrespective of the characteristics of the memory cells, which may therefore be different from memory cells of a PCM type, such as the so-called cells of a FLASH type.

In addition, the gate terminals of the first and the second lower control transistors TC1', TC2' can be set at a controlled voltage, i.e., a voltage generated starting from a voltage reference (for example, a bandgap circuit), different from the reference voltage $V_{refp\_sa}$, even though this solution is far from efficient.

Furthermore, the first upper control transistor TC1 and the first lower control transistor TC1' can have positions reversed with respect to one another. Likewise, the second upper control transistor TC2 and the second lower control transistor TC2' can have positions reversed with respect to one another.

Moreover, albeit not illustrated, a first cascode transistor can be interposed between the first input node SA<0> and the first second-level transistor TYM1, in which case, a second cascode transistor is interposed between the second input node SA<1> and the second second-level transistor TYM2. The voltages present on the gate terminals of the first and the second cascode transistors could be set, for example, to the voltages present on the gate terminals of the first-level and second-level transistors.

In addition, the pair formed by the first upper control transistor TC1 and the first lower control transistor TC1', as also the pair formed by the second upper control transistor TC2 and the second lower control transistor TC2' can be replaced by just the respective lower control transistor, the gate terminal of which is set at the supply voltage $V_{dd}$, in the periods of time during which the signal sPRECH is at '1', and is set at the reference voltage $V_{refp\_sa}$ (or at another controlled voltage) in the periods of time during which the signal sPRECH is at '0'.

It is likewise possible for the first and the second precharge transistors TPRECH1, TPRECH2 to be absent, in which case the precharging step is carried out on the basis of just the currents delivered by the first and the second bias transistors TP1, TP2, and will therefore take place more slowly.

Finally, it is possible for row decoding to envisage further hierarchical levels with respect to what has been described.

What is claimed is:

1. A sense amplifier for a memory device comprising a plurality of memory cells arranged in rows and columns, a plurality of wordlines, a plurality of local bitlines, and a plurality of main bitlines, the sense amplifier comprising:
   a first input node selectively coupled to a first memory cell through a first local bitline and a first main bitline;
   a second input node selectively coupled through a second local bitline and a second main bitline to a second memory cell or to a reference generator configured to generate a reference current;
   a first current generator controllable so as to inject a first variable current into the first input node;
   a second current generator controllable so as to inject a second variable current into the second input node;
   a first branch coupled to the first input node and comprising a first switch circuit, a first sense transistor and a first forcing transistor; and
   a second branch coupled to the second input node and comprising a second switch circuit, a second sense transistor and a second forcing transistor,
   wherein a first conduction terminal of the first sense transistor and a first conduction terminal of the second sense transistor form a first internal node and a second internal node, respectively, the first switch circuit being interposed between the first input node and the first internal node, the second switch circuit being interposed between the second input node and the second internal node, a control terminal of the first sense transistor being coupled to the second internal node and a control terminal of the second sense transistor being coupled to the first internal node,
   wherein the first switch circuit is controllable so as to:
      decouple the first internal node from the first input node causing routing of the first variable current towards the first main bitline, or
      couple the first internal node to the first input node causing division of the first variable current into a first cell current flowing towards the first main bitline, and a first branch current flowing towards the first internal node and being a function of a logic value stored in the first memory cell,
   wherein the second switch circuit is controllable so as to:
      decouple the second internal node from the second input node causing routing of the second variable current towards the second main bitline, or
      couple the second internal node to the second input node causing division of the second variable current into a second cell current flowing towards the second main bitline, and a second branch current flowing towards the second internal node and being a function of a logic value stored in the second memory cell or of the reference current, and
   wherein the first and the second forcing transistors are controllable so as to:
      couple, alternatively, the first and the second internal nodes to a node at a reference potential, or
      switch off so as to enable an evolution of voltages on the first and the second internal nodes, respectively, as a function of first and second branch currents.

2. The sense amplifier according to claim 1, wherein the first and second switch circuits comprise a first control transistor and a second control transistor, respectively, the first and second control transistor being controllable by a first reference voltage when the first and the second internal nodes are coupled to the first and the second input nodes, respectively.

3. The sense amplifier according to claim 2, wherein the first switch circuit further comprises a first switch, the first switch and the first control transistor being interposed between the first input node and the first internal node.

4. The sense amplifier according to claim 3, wherein the second switch circuit further comprises a second switch, the second switch and the second control transistor being interposed between the second input node and the second internal node.

5. The sense amplifier according to claim 1, wherein the first and the second current generators comprise a first bias transistor and a second bias transistor, respectively, wherein the first conduction terminals of the first and second bias transistors are coupled to a supply node configured to be set at a supply voltage, and wherein the second conduction terminals of the first and second bias transistors are coupled to the first and the second input nodes, respectively.

6. The sense amplifier according to claim 5, wherein control terminals of the first and the second bias transistors are configured to be set at a second reference voltage.

7. The sense amplifier according to claim 5, wherein the first and the second current generators further comprise a first precharge transistor and a second precharge transistor, respectively, wherein the first conduction terminals of the first and the second precharge transistors are coupled to the supply node, and wherein the second conduction terminals of the first and the second precharge transistors is coupled to the first and the second input nodes, respectively.

8. The sense amplifier according to claim 1, further comprising a control logic is configured to control the first and the second switch circuits so as to decouple the first and the second internal nodes, respectively, from the first and the second input nodes so that the first and the second variable currents charge the first and the second main bitlines, respectively, while precharging.

9. The sense amplifier according to claim 8, wherein the control logic is further configured to:
control the first and the second forcing transistors so as to couple the first and the second internal nodes to the node at the reference potential; and
control the first and the second switch circuits so as to couple the first and the second internal nodes to the first and the second input nodes, respectively, while unbalancing subsequent to precharging.

10. The sense amplifier according to claim 9, wherein the control logic is further configured to control the first and the second forcing transistors so as to switch off the first and second forcing transistors while evaluating subsequent unbalancing.

11. The sense amplifier according to claim 10, wherein the control logic is further to switch off first and second precharge transistors while unbalancing and evaluating, and to control the first and the second precharge transistors so that they operate in linear region, while precharging.

12. The sense amplifier according to claim 10,
wherein the voltages on the first and on the second internal nodes form, respectively, a first internal logic signal and a second internal logic signal,
wherein, while evaluating, one of the first and second internal logic signals performs a change of logic state so that the first and second internal logic signals assume different logic values, and
wherein the change of logic state is indicative of the logic values stored in the first and the second memory cells when the second input node is coupled to the second memory cell, or of the logic value stored in the first memory cell when the second input node is coupled to the reference generator.

13. The sense amplifier according to claim 12, wherein each of the first and the second internal logic signals substantially varies between the reference potential and a voltage that depends upon a supply voltage and upon the voltage drop that occurs between the first and the second conduction terminals of any one of a first bias transistor and a second bias transistors.

14. The sense amplifier according to claim 13, wherein the sense amplifier is configured to:
receive the first and the second internal logic signals; and
generate a third internal logic signal and a fourth internal logic signal indicative of the logic states of the first and the second internal logic signals and having dynamics that extend substantially between the reference potential and the supply voltage.

15. The sense amplifier according to claim 14, further comprising a latch circuit configured to:
generate an output logic signal, a logic state of which is indicative of the logic values assumed by the third and fourth internal logic signals; and
maintain the logic value of the output logic signal when the third and fourth internal logic signals are substantially equal to the supply voltage.

16. A memory device comprising:
at least one sense amplifier according to claim 1;
the plurality of memory cells;
the plurality of wordlines;
the plurality of local bitlines; and
the plurality of main bitlines.

17. An electronic apparatus comprising:
the memory device according to claim 16;
a controller; and
a bus coupling the controller and the memory device.

18. A method for accessing a memory device, the method comprising:
controlling first and second switch circuits so as to decouple first and second internal nodes, respectively, from first and second input nodes so that first and second variable currents charge, respectively, first and second main bitlines;
then, controlling first and second forcing transistors so as to couple the first and the second internal nodes to a node at a reference potential;
controlling the first and the second switch circuits so as to couple the first and the second internal nodes, respectively, to the first and the second input nodes; and
then controlling the first and second forcing transistors so as to switch off the first and second forcing transistors.

\* \* \* \* \*